US008179939B2

(12) United States Patent
Holonyak, Jr. et al.

(10) Patent No.: US 8,179,939 B2
(45) Date of Patent: *May 15, 2012

(54) LIGHT EMITTING AND LASING SEMICONDUCTOR DEVICES AND METHODS

(75) Inventors: Nick Holonyak, Jr., Urbana, IL (US); Milton Feng, Champaign, IL (US); Gabriel Walter, Urbana, IL (US); Adam James, Urbana, IL (US)

(73) Assignee: The Board of Trustees Of The University Of Illinois, Urbana, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/930,199

(22) Filed: Dec. 31, 2010

(65) Prior Publication Data

US 2011/0164639 A1    Jul. 7, 2011

Related U.S. Application Data

(63) Continuation of application No. 12/287,697, filed on Oct. 10, 2008, now Pat. No. 7,953,133.

(60) Provisional application No. 60/998,645, filed on Oct. 12, 2007.

(51) Int. Cl.
*H01S 5/00* (2006.01)
*H01S 5/34* (2006.01)

(52) U.S. Cl. ................. 372/43.01; 372/45.01

(58) Field of Classification Search ............. 372/43.01, 372/45.01
See application file for complete search history.

(56) References Cited

U.S. PATENT DOCUMENTS

| 5,550,854 | A | 8/1996 | Chen et al. | 372/45.01 |
| 5,892,784 | A | 4/1999 | Tan et al. | 372/43 |
| 6,526,082 | B1 | 2/2003 | Corzine et al. | 372/46.01 |
| 7,091,082 | B2 | 8/2006 | Feng et al. | 438/235 |
| 7,244,997 | B2 | 7/2007 | Appelbaum et al. | 257/425 |
| 7,286,583 | B2 | 10/2007 | Feng et al. | 372/30 |
| 7,354,780 | B2 | 4/2008 | Feng et al. | 438/20 |

(Continued)

FOREIGN PATENT DOCUMENTS

JP    61270885    12/1986

(Continued)

OTHER PUBLICATIONS

Rediker, R.H.; Sawyer, D.E., "Very Narrow Base Diode," Proceedings of the IRE, vol. 45, No. 7, pp. 944-953, Jul. 1957.

(Continued)

*Primary Examiner* — Jessica Stultz
*Assistant Examiner* — Michael Carter
(74) *Attorney, Agent, or Firm* — Martin Novack

(57) ABSTRACT

A two terminal semiconductor device for producing light emission in response to electrical signals, includes: a terminal-less semiconductor base region disposed between a semiconductor emitter region and a semiconductor collector region having a tunnel junction adjacent the base region; the base region having a region therein exhibiting quantum size effects; an emitter terminal and a collector terminal respectively coupled with the emitter region and the collector region; whereby application of the electrical signals with respect to the emitter and collector terminals, causes light emission from the base region. Application of the electrical signals is operative to reverse bias the tunnel junction. Holes generated at the tunnel junction recombine in the base region with electrons flowing into the base region, resulting in the light emission. The region exhibiting quantum size effects is operative to aid recombination.

15 Claims, 9 Drawing Sheets

U.S. PATENT DOCUMENTS

| | | | |
|---|---|---|---|
| 7,535,034 B2 | 5/2009 | Walter et al. | 257/197 |
| 7,813,396 B2 * | 10/2010 | Feng et al. | 372/43.01 |
| 2001/0050934 A1 * | 12/2001 | Choquette et al. | 372/43 |
| 2002/0037022 A1 | 3/2002 | Fukagai | 372/46 |
| 2002/0131464 A1 * | 9/2002 | Sirbu et al. | 372/45 |
| 2003/0043870 A1 * | 3/2003 | Shchukin et al. | 372/45 |
| 2005/0040432 A1 | 2/2005 | Feng et al. | 257/198 |
| 2005/0054172 A1 | 3/2005 | Feng et al. | 438/313 |
| 2008/0240173 A1 | 10/2008 | Holonyak et al. | 372/9 |

FOREIGN PATENT DOCUMENTS

| | | |
|---|---|---|
| JP | 09-074246 | 3/1997 |
| WO | WO97/20353 | 6/1997 |
| WO | WO99/05726 | 2/1999 |
| WO | WO2005/020287 | 3/2005 |
| WO | WO2006/093883 | 9/2006 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James ,and G. Walter; Appl. Phys. Lett 88, 143508 (2006).

Collector Breakdown in the Heterojunction Bipolar Transistor Laser, G. Walter, A. James, N. Holonyak, Jr., M. Feng, and R. Chan Appl. Phys. Lett. 88, 232105 (2006).

High-speed (/spl ges/1 GHz) Electrical and Optical Adding, Mixing, and Processing of Square-Wave Signals With a Transistor Laser, Milton Feng; N. Holonyak, Jr.; R. Chan; A. James; and G. Walter; Photonics Technology Letters, IEEE Volume: 18 Issue: 11; Jun. 2006 pp. 1240-1242.

Graded-Base InGaN/GaN Heterojunction Bipolar Light-Emitting Transistors, B. F. Chu-Kung et al., Appl. Phys. Lett. 89, 082108 (2006).

Carrier LifeTime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan; Appl. Phys. Lett. 89, 113504 (2006).

Chirp in a Transitor Laser: Franz-Keldysh Reduction of the Linewidth Enhancement, G. Walter, A. James, N. Holonyak, Jr., and M. Feng; Appl. Phys. Lett. 90, 091109 (207).

Photon-Assisted Breadkdown, Negative Resistance, and Switching in a Quantum-Well Transistor Laser; A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser; James,A,; Holonyak, N.: Feng, M.; Walter, G., Photonics Technology Letters, IEEE Volumn; 19 issue;9 May 1, 2007, pp. 680-682.

Experimental Determination of the Effective Minority Carrier Lifetime in the Operation of a Quantum-Well n-p-n. Heterojunction Biopolar Light-Emigging Transistor of Varying Base Quantum-Well Design and doping; H.W. Then, M. Feng, N. Holonyak, Jr., and C.H.Wu, Appl. Phys. Lett. 91, 033505 (2007).

Charge Control Analysis of Transistor Laser Operation; M. Feng, N. Holonyak, Jr., H.W. Then, and G. Walter; Appl. Phys. 91, 053501 (2007).

* cited by examiner

| Layer | Comment | SL | Material | x | Thickness (A) | Type | Dopant | Level (/cm³) |
|---|---|---|---|---|---|---|---|---|
| 29 | | | In(x)Ga(1-x)P | 0.49 | 500 | N- | Si | UID |
| 28 | Contact | | GaAs | | 1000 | N+ | Si | 5.0E+18 |
| 27 | Confining | | Al(x)Ga(1-x)As | 0.4 | 300 | N | Si | 3.0E+18 |
| 26 | Confining | | Al(x)Ga(1-x)As | 0.8 | 250 | N | Si | 3.0E+18 |
| 25 | Confining | | Al(x)Ga(1-x)As | 0.95 | 4000 | N | Si | 3.0E+18 |
| 24 | Confining | | Al(x)Ga(1-x)As | 0.8 | 250 | N | Si | 8.0E+17 |
| 23 | Confining | | Al(x)Ga(1-x)As | 0.4 | 300 | N | Si | 5.0E+17 |
| 22 | Emitter | | In(x)Ga(1-x)P | 0.49 | 250 | N- | Si | 3.0E+17 |
| 21 | Base | | GaAs | | 200 | P+ | C | 5.0E+18 |
| 20 | Base | | GaAs | | 100 | P+ | C | 5.0E+18 |
| 19 | Base | | GaAs | | 100 | P+ | C | 5.0E+18 |
| 18 | Base | | GaAs | | 300 | P+ | C | 1.0E+19 |
| 17 | Base | | GaAs | | 10 | P | - | 5.0E+17 |
| 16 | Base | | In(x)Ga(1-x)As | 0.1 | 20 | i | - | UID |
| 15 | Base | | In(x)Ga(1-x)As | 0.2 | 150 | i | - | UID |
| 14 | Base | | In(x)Ga(1-x)As | 0.1 | 20 | i | - | UID |
| 13 | Base | | GaAs | | 10 | P | - | 5.0E+17 |
| 12 | Base | | GaAs | | 200 | P+ | C | 1.5E+19 |
| 11 | Base/Tunnel Junction | | Al(x)Ga(1-x)As | 0.1 | 100 | P+ | C | 6.0E+19 |
| 10 | Tunnel Junction | | GaAs | | 400 | N+ | Si | 7.0E+18 |
| 9 | Confining | | Al(x)Ga(1-x)As | 0.4 | 300 | N | Si | 3.0E+18 |
| 8 | Confining | | Al(x)Ga(1-x)As | 0.8 | 250 | N | Si | 3.0E+18 |
| 7 | Confining | | Al(x)Ga(1-x)As | 0.98 | 4000 | N | Si | 3.0E+18 |
| 6 | Confining | | Al(x)Ga(1-x)As | 0.8 | 250 | N | Si | 3.0E+18 |
| 5 | Confining | | Al(x)Ga(1-x)As | 0.4 | 300 | N | Si | 5.0E+18 |
| 4 | Etch Stop | | In(x)Ga(1-x)P | 0.49 | 120 | N | Si | 5.0E+17 |
| 3 | Contact | | GaAs | | 3000 | N | Si | 5.0E+18 |
| 2 | Etch Stop | | In(x)Ga(1-x)P | 0.49 | 400 | UID | Si | UID |
| 1 | Buffer | | GaAs | | 5000 | UID | | UID |
| | Substrate | | 4" GaAs | | | SI/ Doped | | |

FIG. 7

LIGHT EMITTING AND LASING SEMICONDUCTOR DEVICES AND METHODS

PRIORITY CLAIM

This is a continuation of U.S. application Ser. No. 12/287, 697 filed Oct. 10, 2008, now U.S. Pat. No. 7,953,133 which claims priority from U.S. Provisional Patent Application No. 60/998,645 filed Oct. 12, 2007.

GOVERNMENT SUPPORT

This invention was made with government support under DARPA Contract Number HR0011-04-1-0034, and the government has certain rights in the invention.

FIELD OF THE INVENTION

This invention relates to two terminal semiconductor devices for producing light emission and laser emission in response to electrical signals. The invention also relates to methods for producing light emission and laser emission from semiconductor devices, including such emission that can be controlled with very fast response time.

BACKGROUND OF THE INVENTION

A part of the background hereof lies in the development of light emitters based on direct bandgap semiconductors such as III-V semiconductors. Such devices, including light emitting diodes and laser diodes, are in widespread commercial use.

Another part of the background hereof lies in the development of wide bandgap semiconductors to achieve high minority carrier injection efficiency in a device known as a heterojunction bipolar transistor (HBT). These transistor devices are capable of operation at extremely high speeds. For example, InP HBTs have, in recent years, been demonstrated to exhibit operation at speeds above 500 GHz.

Another part of the background hereof lies in the development of heterojunction bipolar transistors which operate as light-emitting transistors and laser transistors. Reference can be made, for example, to U.S. Pat. No. 7,091,082 and to the following: U.S. patent application Ser. No. 10/646,457, filed Aug. 22, 2003; U.S. patent application Ser. No. 10/861,320, filed Jun. 4, 2004; U.S. patent application Ser. No. 11/068, 561, filed Feb. 28, 2005; U.S. patent application Ser. No. 11/175,995, filed Jul. 6, 2005; and U.S. patent application Ser. No. 11/364,893, filed Feb. 27, 2006; PCT International Patent Publication Number WO/2005/020287, published Mar. 3, 2005, and PCT International Patent Publication Number WO/2006/006879 published Aug. 9, 2006; all the foregoing being assigned to the same assignee as the present Application. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak, M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, G. Walter, Appl. Phys. Lett. 88, 14508 (2006).

FIG. 1 is a band diagram of a conventional double-heterojunction quantum-well diode laser. Electrons are typically injected from high to low gap (left side of FIG. 1) and holes injected from high gap to low gap (right side of FIG. 1) into a central lower gap quantum well (QW) region where electrons and holes are collected in the QW(s) and recombine generating recombination radiation (photons). The tilted schematic generic mirror arrangement can be, for example, any of an edge-emitter, vertical cavity, or DFB configuration. The heterobarriers of the diode laser serve the further purpose, besides injection, of confining carriers and photons so that the electromagnetic field and stimulated emission can be high (maximum) at the point of recombination, at the QW(s). Besides the parasitic circuit properties of the diode (resistance, capacitance, etc.) the speed of the diode is largely determined by the carrier "pile-up" and how "fast" recombination can reduce ("clean-out") the stored (injected) charge. Inevitably, at high enough speed, the charge-photon interaction leads to a resonance peak and speed limitation. Charge storage becomes a nuisance. FIG. 2 shows graphs of calculated diode laser charge-photon resonance peaks which pose a limitation to linear frequency response ("speed" of operation). The calculation uses a photon lifetime for a 400 μm cavity length and indicates the effect of recombination lifetime on the charge-photon resonance.

It is among the objects of the present invention to provide two-terminal semiconductor light emitting devices and laser devices which overcome prior art limitations, including those summarized above, and which exhibit improved properties including higher speed of operation. It is also among the objects of the present invention to provide improved methods for producing light emission and laser emission from semiconductor device, including such emission that can be controlled with very fast response time.

SUMMARY OF THE INVENTION

An advantage of the invented device structure and method, is that the EM field confinement on the collector side (bottom side of the base) can be shifted down into the "collector" body and thus allow "tuning" of the EM field to maximize the stimulated recombination (emission) at the position of the base QW(s). The appropriate high doping of the p-type "base" region is not necessarily limiting. This is known from the extremely high acceptor doping of the original diffused junction diode lasers (GaAs and GaAsP), and from the subsequent tunnel-contact edge emitting and vertical cavity lasers, and more recently, transistor lasers. Thus, it is possible to dope-in holes in high performance lasers, and avoid the injection and transport of holes, which are high in mass, sluggish, and poorly conducting. This is a part of the structure and technique of a form of the invention. The two terminal device hereof is simpler in some respects than a three terminal transistor, with its need for a lateral base contact. The two terminal device can be made relatively smaller and faster.

In accordance with a form of the invention, there is provided a two terminal semiconductor device for producing light emission in response to electrical signals, including: a terminal-less semiconductor base region disposed between a semiconductor emitter region and a semiconductor collector region having a tunnel junction adjacent the base region; the base region having a region therein exhibiting quantum size effects; an emitter terminal and a collector terminal respectively coupled with the emitter region and the collector region; whereby application of the electrical signals with respect to the emitter and collector terminals, causes light emission from said base region. [A "terminal-less" region means a region that does not have an associated terminal to and/or from which signals are applied and/or received with respect to the region.] Application of the electrical signals is operative to reverse bias the tunnel junction. Holes generated at the tunnel junction recombine in the base region with electrons flowing into the base region, resulting in said light emission. The region exhibiting quantum size effects is operative to aid said recombination.

In embodiments of this form of the invention, the region exhibiting quantum size effects can comprise, for example, one or more quantum wells and/or one or more regions of quantum dots and/or one or more regions of other type exhibiting quantum size effects.

In one preferred embodiment of the invention, an optical cavity encloses at least a portion of the base region, and said light emission comprises laser emission. The optical cavity may be, for example, a lateral cavity or a vertical cavity with respect to the base. In a form of this embodiment, the tunnel junction comprises a p+ layer adjacent said base region and an n+ layer adjacent said collector region. Also in this embodiment, the thickness of base region, between said emitter and collector regions, is less than about $2\lambda_\mu/n$ microns, where n is the effective index of refraction and $\lambda_\mu$ (μm)=$1.2398/E_g$ is the wavelength in microns, and $E_g$ is the energy gap in electron volts (eV). Also in this embodiment, the spacing between the tunnel junction and the region exhibiting quantum size effects is preferably less than about 300 Angstroms, and, more preferably between about 5 and 100 Angstroms. In a form of this embodiment, there is further provided a barrier region, to enhance collection and recombination of electrons at the region exhibiting quantum size effects, at the expense of electrical collection at the collector region. The barrier region is spaced from the region exhibiting quantum size effects. It is preferably disposed at the transition from the base region to the collector region. The barrier region preferably comprises a semiconductor layer of higher energy gap than the semiconductor of said base region.

In accordance with another form of the invention, a method is set forth for producing light emission from a semiconductor device, including the following steps: providing a semiconductor base region disposed between a semiconductor emitter region and a semiconductor collector region that has a tunnel junction adjacent the base region; providing, in the base region, a region exhibiting quantum size effects; and applying electrical signals with respect to an emitter terminal, coupled with emitter region, and a collector terminal coupled with the collector region, to produce light emission from the base region.

In an embodiment of this form of the invention, the step of applying said electrical signals includes reverse biasing the tunnel junction; whereby electrons injected into the base, via the emitter, recombine, in the base region, with holes generated by the tunnel junction, resulting in said light emission, the recombination being aided by the region exhibiting quantum size effects.

In accordance with a further form of the invention, a method is set forth for producing light emission from a semiconductor device, including the following steps: providing a terminal-less p-type semiconductor base region disposed between an n-type semiconductor emitter region and an n-type semiconductor collector region that has a tunnel junction adjacent the base region; and applying electrical signals with respect to an emitter terminal, coupled with the emitter region, and a collector terminal coupled with the collector region, to produce said light emission from the base region.

In accordance with still another form of the invention, a method is set forth for producing light emission from a semiconductor device, including the following steps: providing a terminal-less p-type semiconductor base region disposed between an n-type semiconductor emitter region and an n-type semiconductor collector region; providing, in the base region, a region exhibiting quantum size effects; providing, in the collector region, adjacent the base region, a source of hole carriers; and applying electrical signals with respect to an emitter terminal, coupled with the emitter region, and a collector terminal coupled with the collector region, to produce light emission from the base region.

Further features and advantages of the invention will become more readily apparent from the following detailed description when taken in conjunction with the accompanying drawings.

BRIEF DESCRIPTION OF THE DRAWINGS

FIG. 7 shows the epitaxially grown layers of the crystal structure of a heterojunction bipolar transistor laser (HBTL) used for proof-of-concept operation of a tunnel contact diode laser with the charge configuration of a transistor laser.

DESCRIPTION OF THE INVENTION

Figure 1:
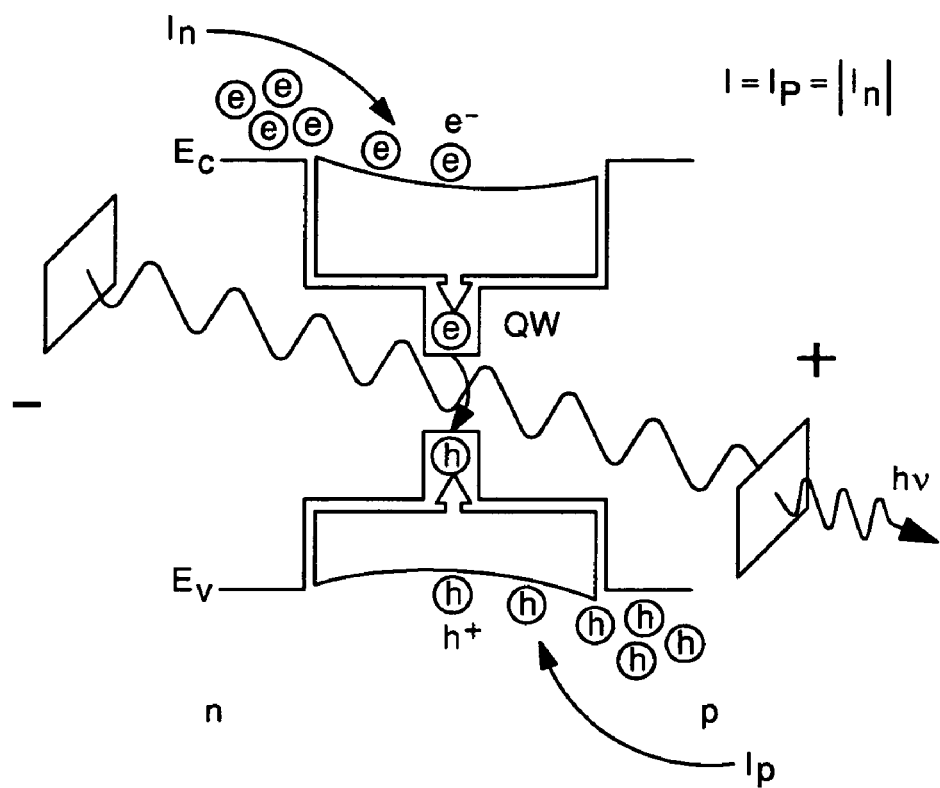
FIG. 1 is a band diagram of a conventional double-heterojunction quantum-well diode laser.
Figure 2:
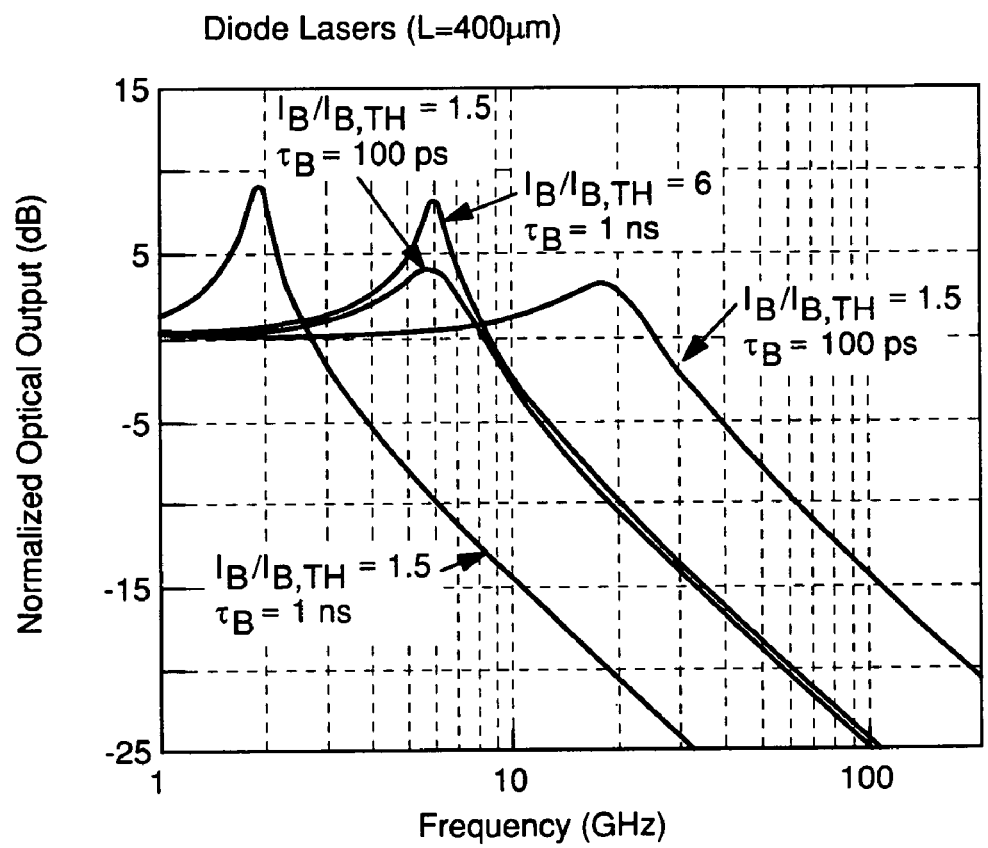
FIG. 2 shows graphs of calculated diode laser charge-photon resonance peaks which pose a limitation to linear frequency response ("speed" of operation). The calculation uses a photon lifetime for a 400 μm cavity length and indicates the effect of recombination lifetime on the charge-photon resonance.
Figure 3:
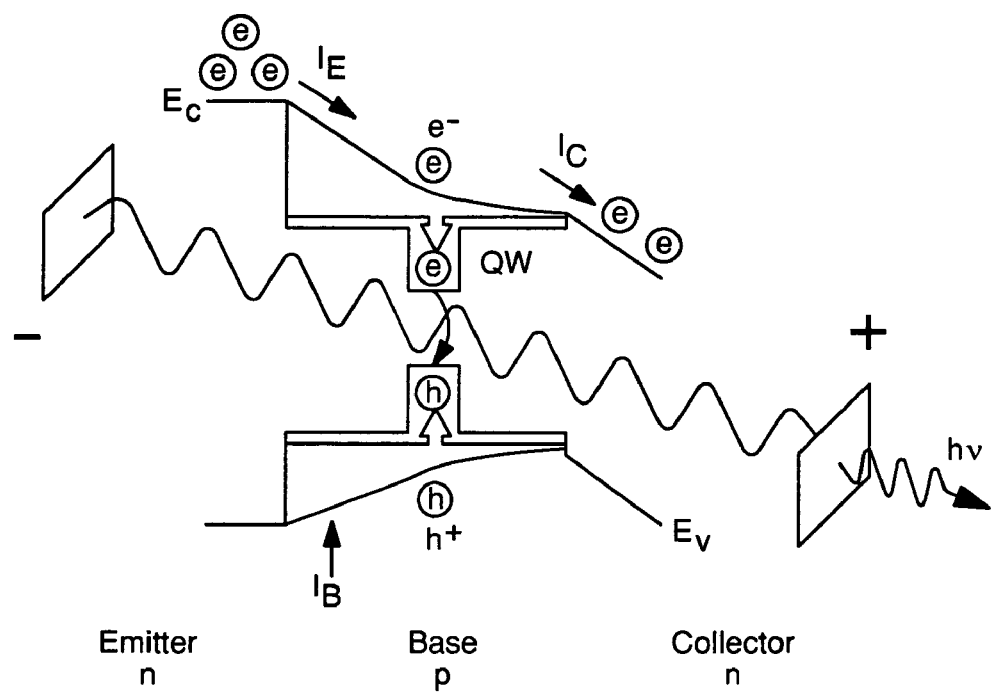
FIG. 3 shows the transistor laser energy bands for a transistor laser having a quantum well (QW) or wells (QWs) built into the base, near the collector, competing as an "optical" collector with the electrical collector, capturing and recombining electrons and delivering recombination radiation.

In approaching the problem of improving the operating speed of existing HBT laser diodes, we start by further analyzing operation of our transistor laser, which is first mentioned in the Background section hereof. A form of the transistor laser is an n-p-n heterojunction bipolar transistor, an n-p-n HBT, with electrons injected at the emitter and transporting efficiently (easily, low mass, high mobility) by diffusion to the collector. The injected electrons are essentially tilted, by diffusion, into a triangular distribution pinned at zero concentration at the base-collector junction. Holes in III-V crystals are high mass and sluggish, and are built-in (acceptor doping), at high concentration, in the p+ base. For a transistor to be a transistor some electrons recombine with holes in the base ($I_B$≠0 and $I_E$=$I_B$+$I_C$, giving gain β=$I_C/I_B$), the lost positive charge being resupplied by dielectric relaxation (not injection) by the base contact. It is emphasized that the holes are not injected. They are slow, sluggish and not transported. The n-p-n HBT laser uses the fast electron and not the slow hole, which makes the device fast. As illustrated in the band diagram of FIG. 3 (which shows the transistor laser energy bands), our transistor laser has a quantum well (QW) or wells (QWs) built into the base, near the collector, competing as an "optical" collector with the electrical collector, capturing and recombining electrons and delivering recombination radiation. The QW added to the base, increases the base recombination rate, decreases the transistor gain (β), increases the bandwidth, and increases the device speed. Figuratively, the transistor, is "stretched" to use and enhance its inherent base recombination to become a fast recombination radiation device, with the recombination radiation being put to good use. In the transistor or transistor laser the charge configuration, the injected electron distribution, is essentially a triangular distribution (e.g. FIG. 3), not "flat" as in a diode that "bounces" the charge, in yo-yo fashion, up and down with current level. Rather, it tilts up and down, pinned at the QW optical collector and the primary electrical collector, and thus is fed with the charge slope, current, and not just simple recombination of the carrier population. Near the collector region the charge level tends to be stabilized, tilting up and down (in slope) but not bouncing up and down with a large change in population. At the QW point of recombination (near the electrical collector), the charge density (carrier population) change is not large, but the current (slope) change is. Therein lies the solution to reduction or elimination of the charge-resonance peak which Applicant has observed in the transistor laser (see e.g. M. Feng, N. Holonyak, Jr., A. James, K. Cimino, G. Walter, and R. Chan, Appl. Phys. Lett. 89, 113504; 2006).

Once the foregoing principles, and the potential further advantages thereof, are recognized, part of the remaining challenge involves the difficulty of applying these principles to advantage in a diode, a two terminal device. It will be desirable to have the injected electron charge profile in the diode look like that in the transistor laser, which, in some respects looks like a "short-base diode", but it would be undesirable to have the metal contact of a short-base diode at the position of the transistor base-collector junction. (A so-called "very narrow base diode" is described, for example, in Rediker, R. H.; Sawyer, D. E., "Very Narrow Base Diode," Proceedings of the IRE, vol. 45, no. 7, pp. 944-953, July 1957.) Such a contact would tend to cannibalize the current flow to the QW and, worse, possibly short-out the E and M (photon) field near the QW and ruin the stimulated QW recombination. The solution in a form of the present invention is to replace the regular collector of the transistor laser with a tunnel-junction collector; that is, a tunnel contact which, in reverse bias, acts to tunnel electrons out of the base and leave holes (replace holes) in the base on the collector side of the base QW. No base contact is required.

Figure 4:
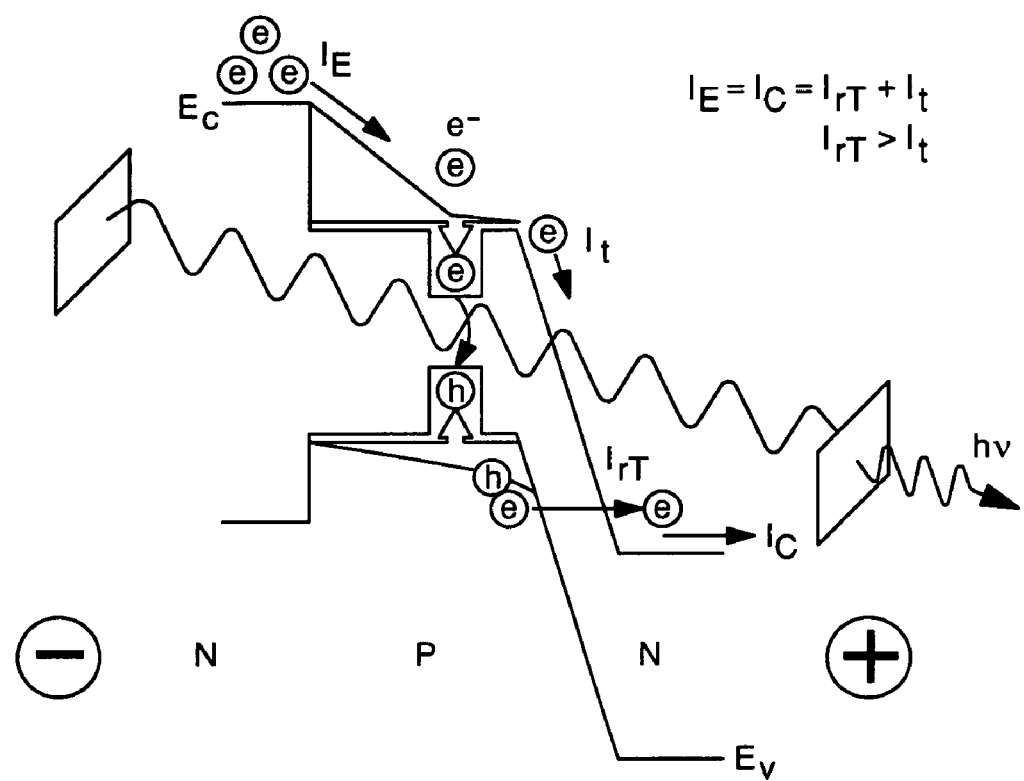
FIG. 4, shows the band diagram of an embodiment of the diode laser hereof, which retains the dynamic tilted population of the transistor laser while removing the limitations of the base lateral conduction and base-collector capacitance by combining the base and collector terminal through the use of a tunnel-junction.

Reference can be made to the band diagram of FIG. 4, wherein it is seen that an embodiment of the diode laser hereof retains the dynamic tilted population of the transistor laser while removing the limitations of the base lateral conduction and base-collector capacitance by combining the base and collector terminal through the use of a tunnel-junction. The holes, instead of relaxing laterally into the base from a base contact (to feed the recombination), are supplied and relax into the base, and QW, by the collector tunnel "contact" which on the n-type collector side is supplied by a low-loss electron current ($I_C$ in FIG. 4).

An advantage of the invented device structure and method, is that the EM field confinement on the collector side (bottom side of the base) can be shifted down into the "collector" body and thus allow "tuning" of the EM field to maximize the stimulated recombination (emission) at the position of the base QW(s). The appropriate high doping of the p-type "base" region is not necessarily limiting. This is known from the extremely high acceptor doping of the original diffused junction diode lasers (GaAs and GaAsP), and from the subsequent tunnel-contact edge emitting and vertical cavity lasers, and more recently, transistor lasers. Thus, it is possible to dope-in holes in high performance lasers, and avoid the injection and transport of holes, which are high in mass, sluggish, and poorly conducting. This is a part of the structure and technique of a form of the invention. The two terminal device hereof is simpler in some respects than a three terminal transistor, with its need for a lateral base contact. The two terminal device can be made relatively smaller and faster.

In accordance with a form of the invention, there is provided a two terminal semiconductor device for producing light emission in response to electrical signals, including: a terminal-less semiconductor base region disposed between a semiconductor emitter region and a semiconductor collector region having a tunnel junction adjacent the base region; the base region having a region therein exhibiting quantum size effects; an emitter terminal and a collector terminal respectively coupled with the emitter region and the collector region; whereby application of the electrical signals with respect to the emitter and collector terminals, causes light emission from said base region. [A "terminal-less" region means a region that does not have an associated terminal to and/or from which signals are applied and/or received with respect to the region.] Application of the electrical signals is operative to reverse bias the tunnel junction. Holes generated at the tunnel junction recombine in the base region with electrons flowing into the base region, resulting in said light emission. The region exhibiting quantum size effects is operative to aid said recombination.

In embodiments of this form of the invention, the region exhibiting quantum size effects can comprise, for example, one or more quantum wells and/or one or more regions of quantum dots and/or one or more regions of other type exhibiting quantum size effects.

In one preferred embodiment of the invention, an optical cavity encloses at least a portion of the base region, and said light emission comprises laser emission. The optical cavity may be, for example, a lateral cavity or a vertical cavity with respect to the base. In a form of this embodiment, the tunnel junction comprises a p+ layer adjacent said base region and an n+ layer adjacent said collector region. Also in this embodiment, the thickness of base region, between said emitter and collector regions, is less than about $2\lambda_\mu/n$ microns, where n is the effective index of refraction and $\lambda_\mu (\mu m)=1.2398/E_g$ is the wavelength in microns, and $E_g$ is the energy gap in electron volts (eV). Also in this embodiment, the spacing between the tunnel junction and the region exhibiting quantum size effects is preferably less than about 300 Angstroms, and, more preferably between about 5 and 100 Angstroms. In a form of this embodiment, there is further provided a barrier region, to enhance collection and recombination of electrons at the region exhibiting quantum size effects, at the expense of electrical collection at the collector region. The barrier region is spaced from the region exhibiting quantum size effects. It is preferably disposed at the transition from the base region to the collector region. The barrier region preferably comprises a semiconductor layer of higher energy gap than the semiconductor of said base region.

In accordance with another form of the invention, a method is set forth for producing light emission from a semiconductor device, including the following steps: providing a semiconductor base region disposed between a semiconductor emitter region and a semiconductor collector region that has a tunnel junction adjacent the base region; providing, in the base region, a region exhibiting quantum size effects; and applying electrical signals with respect to an emitter terminal, coupled with emitter region, and a collector terminal coupled with the collector region, to produce light emission from the base region.

In an embodiment of this form of the invention, the step of applying said electrical signals includes reverse biasing the tunnel junction; whereby electrons injected into the base, via the emitter, recombine, in the base region, with holes generated by the tunnel junction, resulting in said light emission, the recombination being aided by the region exhibiting quantum size effects.

In accordance with a further form of the invention, a method is set forth for producing light emission from a semiconductor device, including the following steps: providing a terminal-less p-type semiconductor base region disposed between an n-type semiconductor emitter region and an n-type semiconductor collector region that has a tunnel junction adjacent the base region; and applying electrical signals with respect to an emitter terminal, coupled with the emitter region, and a collector terminal coupled with the collector region, to produce said light emission from the base region.

In accordance with still another form of the invention, a method is set forth for producing light emission from a semiconductor device, including the following steps: providing a terminal-less p-type semiconductor base region disposed between an n-type semiconductor emitter region and an n-type semiconductor collector region; providing, in the base region, a region exhibiting quantum size effects; providing, in the collector region, adjacent the base region, a source of hole carriers; and applying electrical signals with respect to an emitter terminal, coupled with the emitter region, and a collector terminal coupled with the collector region, to produce light emission from the base region.

Figure 5:
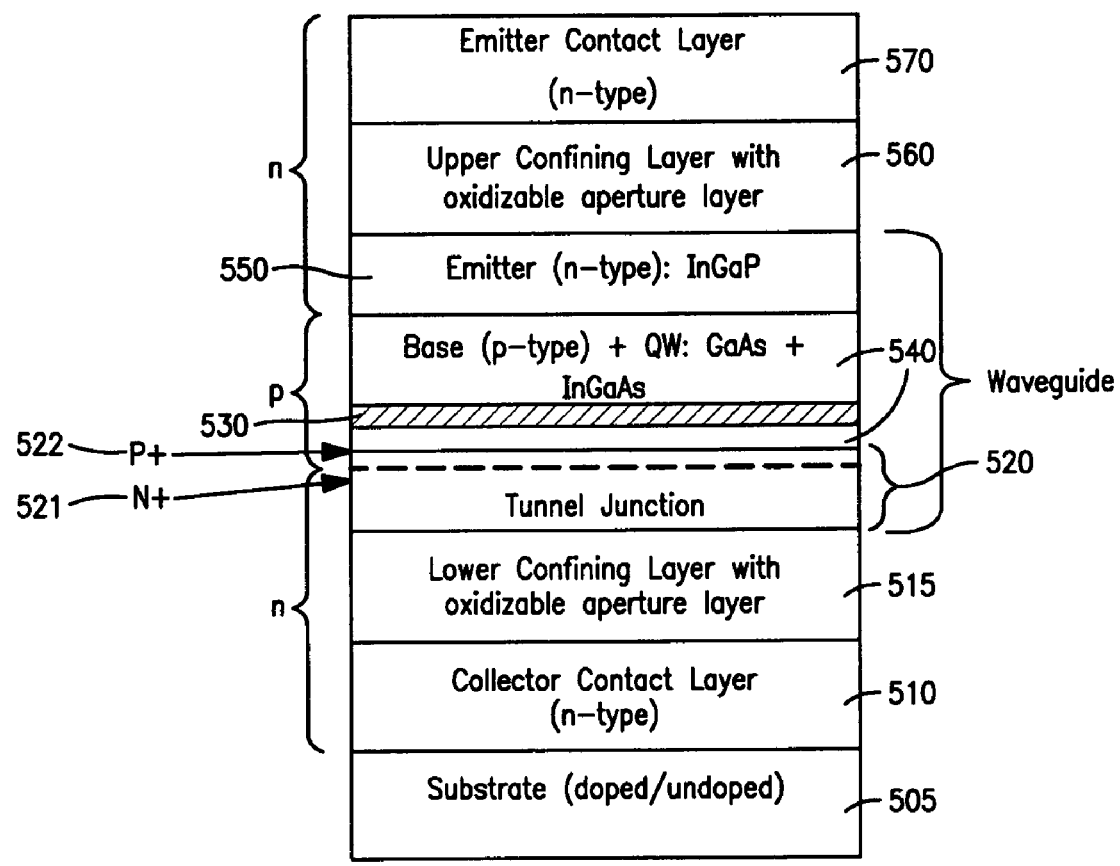
FIG. 5 shows a simplified cross-sectional diagram, not to scale, of the layering of an embodiment of the invention in the form of an edge emitting n-p-n tunnel junction diode laser.

FIG. 5 shows a simplified cross-sectional diagram, not to scale, of the layering of an embodiment of the invention in the form of an edge emitting n-p-n tunnel junction diode laser. The GaAs substrate 505, doped or undoped, has disposed thereon: n-type GaAs collector contact layer 510; n-type $Al_xGa_{1-x}As$ lower confining layer 515 with oxidizable aperture layer (not separately shown); tunnel contact 520, which includes n+GaAs tunnel junction layer 521 and p+$Al_xGa_{1-x}$As tunnel junction layer 522; p-type GaAs base layer which has an $In_xGa_{1-x}As$ quantum well (QW) 530 therein; n-type $In_xGa_{1-x}P$ emitter layer 550; n-type $Al_xGa_{1-x}As$ upper confining layer 560 with oxidizable aperture layer (not separately shown); and n-type GaAs emitter contact layer 570. The edge reflectors, for example cleaved mirror surfaces, are not shown.

Figure 6:
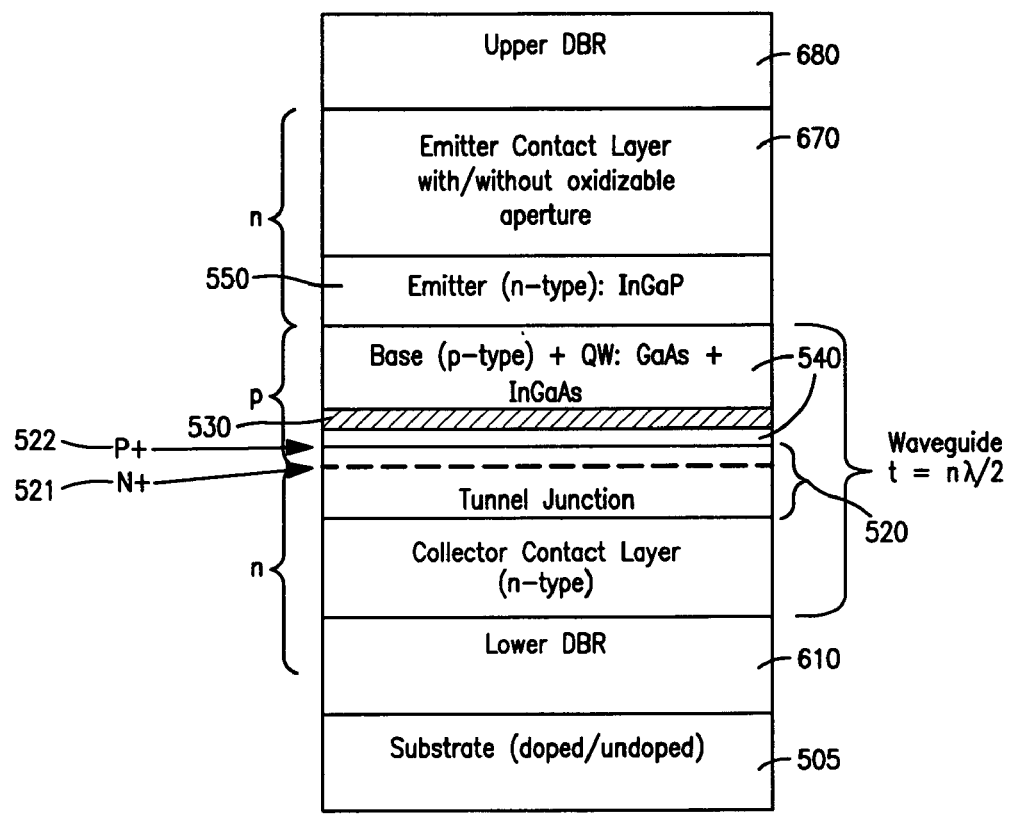
FIG. 6 shows a simplified cross-sectional diagram, not to scale, for the layering of an embodiment of the invention in the form of a vertical emitting n-p-n tunnel junction diode laser.

FIG. 6 shows a simplified cross-sectional diagram, not to scale, for the layering of an embodiment of the invention in the form of a vertical emitting n-p-n tunnel junction diode laser. The layers 505, 520 (including 521 and 522), 530, 540, and 550 correspond generally to layers of like reference numerals in FIG. 5. The device of FIG. 6 also includes, lower distributed Bragg reflector (DBR) 610, emitter contact layer (with or without oxidizable aperture) 670, and upper DBR 680.

In contrast to injecting the electron and transporting it to be "collected" and recombine at the QW, the devices and techniques of embodiments of the invention do not inject holes. Holes are not transported. Rather, the "collector" tunnel contact is employed to generate and relax holes (upward) into the nearby QW to support the recombination. In this arrangement the hole is not used in conduction. It is generated by the tunnel contact almost at the point of use, for example, only about a 100 or 100's of Angstroms away from the QW (the point of recombination). In contrast to a conventional QW diode laser, not only does this device and technique tilt the injected electrons into a diffusion current triangle (as in a transistor laser), it also reduces hole conduction loss. Thus, devices hereof can operate at much higher speed, well beyond the usual speed of carrier-population photon resonance cut-off.

FIG. 7 shows the epitaxially grown layers of the crystal structure of a heterojunction bipolar transistor laser (HBTL) used for proof-of-concept operation of a tunnel contact diode laser with the charge configuration of a transistor laser. Upward from the substrate, the epitaxial layers include a 5000 Å n-type undoped GaAs buffer layer (Layer 1), a 400 Å InGaP etch stop layer (Layer 2), a 3000 Å n-type GaAs contact layer (Layer 3), another 120 Å of InGaP etch stop layer (Layer 4), followed by a 300 Å n-type $Al_{0.40}Ga_{0.60}As$ layer (Layer 5), a 250 Å n-type $Al_{0.80}Ga_{0.20}As$ layer (Layer 6), a 4000 Å n-type $Al_{0.95}Ga_{0.05}As$ layer (Layer 7), a 250 Å n-type $Al_{0.80}Ga_{0.20}As$ layer (Layer 8), and a 300 Å n-type $Al_{0.40}Ga_{0.60}As$ layer (Layer 9) forming the bottom cladding or confining layers.

These layers are followed by a 400 Å heavily Si-doped n-type GaAs layer (Layer 10) and a 100 Å C-doped p-type $Al_{0.10}Ga_{0.90}As$ layer (Layer 11), the layers 10 and 11 comprising the tunnel junction or tunnel contact. Then, a 1110 Å p-type GaAs base layer (Layers 12 to 21), which includes also (in the base region) a 190 Å InGaAs QW, designed for emission at $\lambda \approx 900$ nm (Layers 14 to 16). The interface between Layer 11 and 12 is a feature of an embodiment of the invention that forms a step in energy gap that tunes and reduces the electrical gain of the system. The benefit of the energy gap "barrier" of Layer 11 is described further hereinbelow.

On top of the p-type base a heterostructure emitter is grown, including a 250 Å n-type $In_{0.49}Ga_{0.51}P$ layer (Layer 22) and a 300 Å n-type $Al_{0.4}Ga_{0.6}As$ (Layer 23). The upper confining layer structure is completed with the growth of a 250 Å n-type $Al_{0.80}Ga_{0.20}As$ oxidation buffer layer (Layer 24) and a 4000 Å n-type $Al_{0.95}Ga_{0.05}As$ oxidizable layer (Layer 25), a 250 Å n-type $Al_{0.80}Ga_{0.20}As$ oxidation buffer layer (Layer 26) and a 300 Å n-type $Al_{0.40}Ga_{0.60}As$ layer (Layer 27). Finally, the HBLET laser structure is capped with a 1000 Å heavily doped n-type GaAs contact layer (Layer 28) and a 500 Å InGaP cap layer (Layer 29).

Figure 8:
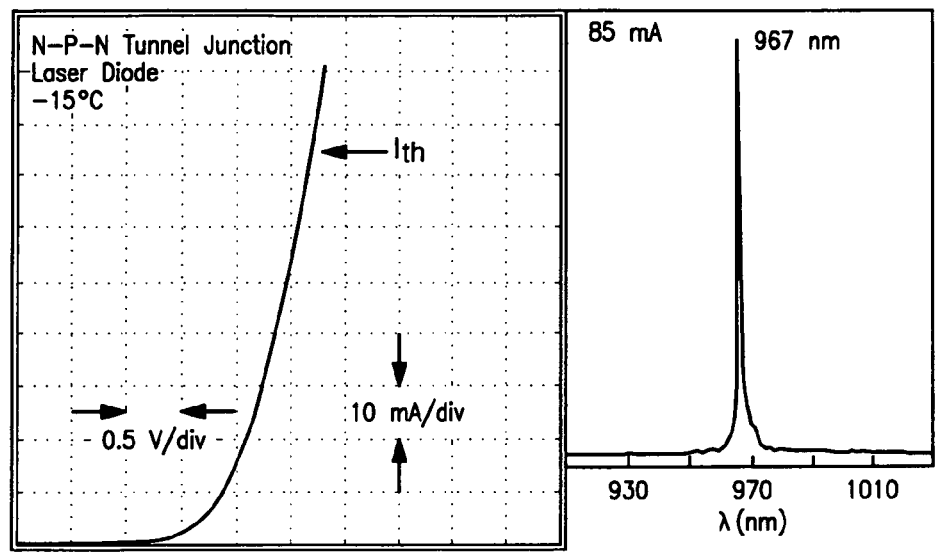
FIG. 8 shows the I-V characteristics of a 400 μm long, top and bottom oxide-defined apertures (~6 μm), tunnel-junction E-B-C diode laser biased at −15° C. The laser exhibits a threshold of 75 mA and lasing wavelength at 967 nm.

FIG. 8 shows the I-V characteristics of a 400 µm long, top and bottom oxide-defined apertures (~6 µm), tunnel-junction E-B-C diode laser biased at −15° C. The laser exhibits a threshold of 75 mA and lasing wavelength at 967 nm.

Figure 9:
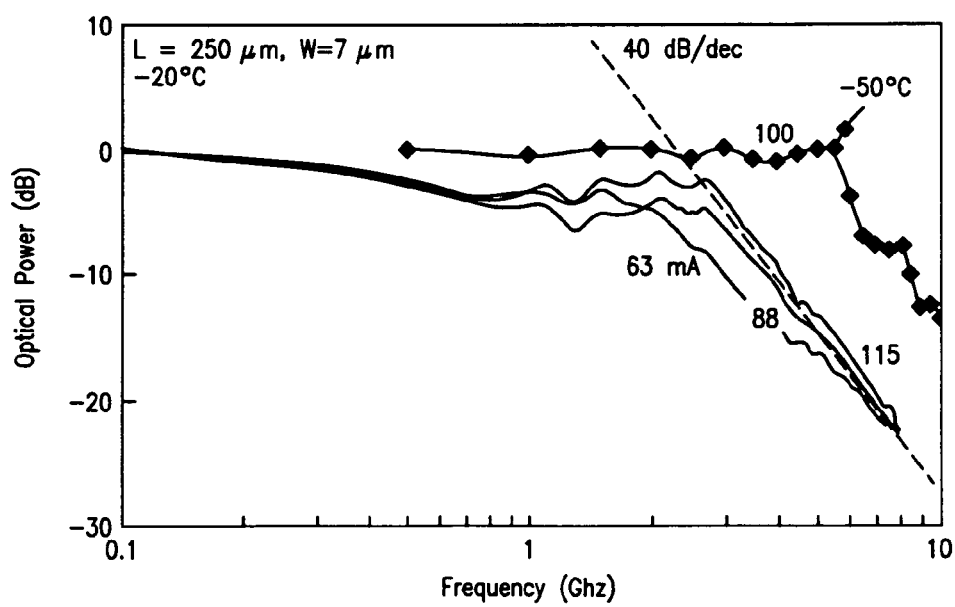
FIG. 9 shows the optical frequency response of a tunnel junction NPN laser diode that is 250 μm long and has a stripe width of 7 μm. The device has a threshold of ~50 mA at −20° C., and exhibits the absence of distinct resonance peaks typically associated with conventional double heterostructure quantum well lasers despite being operated at low ratios of bias to threshold current ($I_{op}/I_{th}$<2.5).

FIG. 9 shows the optical frequency response of a tunnel junction NPN laser diode that is 250 µm long and has a stripe width of 7 µm. The device has a threshold of ~50 mA at −20° C., and exhibits the absence of distinct resonance peaks typically associated with conventional double heterostructure quantum well lasers despite being operated at low ratios of bias to threshold current ($I_{op}/I_{th}$<2.5).

Figure 10:
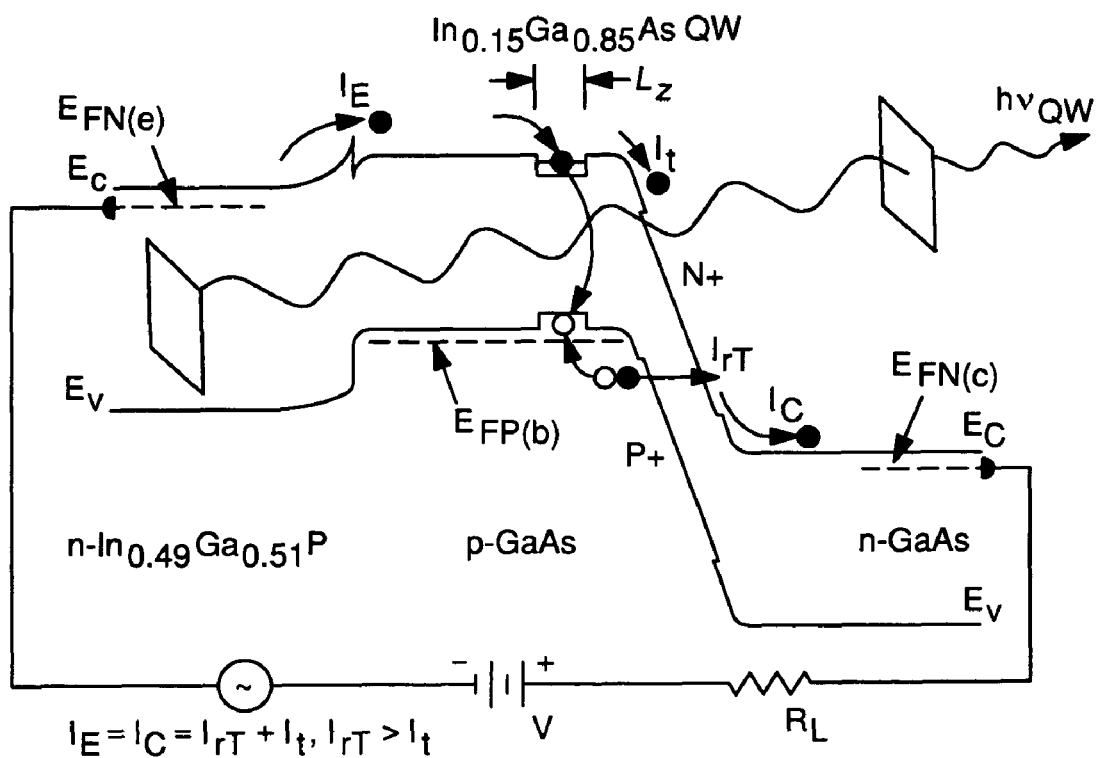
FIG. 10 shows the band diagram of a biased tunnel junction $E_N$-$B_P$-$C_N$ diode laser device hereof, driven with a sinusoidal signal.

FIG. 10 shows the band diagram of a biased tunnel junction $E_N$-$B_P$-$C_N$ diode laser device hereof, driven with a sinusoidal signal.

The previously referenced feature relating to the step in energy gap at Layer 11 (FIG. 7) will next be described in further detail. In a preferred embodiment hereof, it is desirable to locate the quantum well (or other quantum size) recombination region as far from the emitter and as close to the electrical collector as practicable, the reason being to have the maximum injected population (electrons) in the p-type base at the emitter, and the minimum population in the region of the QW recombination slightly displaced from the electrical collector, but as close as possible to the tunnel collector source of holes, i.e., right at the edge of the p-type base. Applicant discovered that it is desirable to be able to modulate and change the level of the injection, changing the current through the base to feed the QW, but not change the charge density much, just the injected charge slope (the "tilt"). This is for speed reasons, to eliminate the photon-charge resonance limitation of conventional diode lasers. The question, then, was how to adjust and split the amount of "emitter" current $I_E$ that goes into QW recombination and how much transports to the electrical collector, or the fraction $\alpha$ ($\alpha=I_C/I_E$)—the part that is not recombination (photons). To this end, it is possible to, at the edge, of the base-collector region to raise the energy gap (e.g., an $Al_X Ga_{1-X}$ As layer, in this embodiment) a little to act slightly as a "dam" to reflect some of the injected-electrons in order to favor the QW "collection" at the expense of electrical collection. The aluminum fraction of the collector "dam" layer $Al_xGa_{1-x}As$, x, can thus become a design parameter to adjust the splitting of the current between QW recombination and electrical collection.

In accordance with another feature of the invention, the transport process of election carriers from the emitter to the quantum size region (e.g., the QW) of the base can be enhanced. At least a portion of the base region, between the emitter region and the region exhibiting quantum size effects, is graded in energy bandgap, from higher energy bandgap near the emitter region to lower energy bandgap near the QW. The higher energy gap near the emitter helps the transport of injected carriers from the emitter to the QW. The emitter itself is of higher gap than the adjacent high-gap base material. As an example, near an InGaP emitter region, the base can be $Al_xGa_{1-x}As$ with x=0.1, with the base composition grading down to x=0 near the QW. This puts field assistance also in the diffusion process transporting electrons from the emitter to the quantum well, and enhances the tilted charge operation of the device.

The invention claimed is:

1. A method for producing light emission from a semiconductor device, comprising the steps of:
providing a terminal-less semiconductor base region disposed between a semiconductor emitter region and a semiconductor collector region that has a tunnel junction adjacent said base region;
providing, in said base region, a region exhibiting quantum size effects at a spacing from said tunnel junction of less than about 300 Angstroms; and
applying electrical signals with respect to an emitter terminal, coupled with said emitter region, and a collector terminal coupled with said collector region, to produce said light emission from the base region.

2. The method as defined by claim 1, wherein said step of applying said electrical signals includes reverse biasing said tunnel junction; whereby electrons injected into the base, via the emitter, recombine, in the base region, with holes generated by the tunnel junction, resulting in said light emission.

3. The method as defined by claim 1, wherein said step of applying said electrical signals includes reverse biasing said tunnel junction; whereby electrons injected into the base, via the emitter, recombine, in the base region, with holes generated by the tunnel junction, resulting in said light emission, said recombination being aided by the region exhibiting quantum size effects.

4. The method as defined by claim 1, wherein said step of providing a semiconductor base region disposed between a semiconductor emitter region and a semiconductor collector region that has a tunnel junction adjacent said base region includes providing an n-type semiconductor emitter region, a p-type semiconductor base region, and an n-type semiconductor collector region.

5. The method as defined by claim 4, wherein said step of providing a terminal-less p-type semiconductor base region comprises providing a p+ region.

6. The method as defined by claim 1, further comprising the step of providing a barrier region, to enhance collection and recombination of electrons at the region exhibiting quantum size effects, at the expense of electrical collection at the collector region.

7. The method as defined by claim 1, further comprising the step of providing an optical cavity enclosing at least a portion of said base region, said light emission comprising laser emission.

8. The method as defined by claim 7, wherein said step of providing an optical cavity enclosing at least a portion of said base region comprises providing an optical cavity that is partially transmissive.

9. The method as defined by claim 1, further comprising the step of grading, in energy bandgap, at least a portion of the base region, between the emitter region and the region exhibiting quantum size effects, from higher energy bandgap near the emitter region to lower energy bandgap near the region exhibiting quantum size effects.

10. The method as defined by claim 1, wherein said step of providing, in said base region, a region exhibiting quantum size effects, comprises providing said region exhibiting quantum size effects at a spacing from said tunnel junction in the range between about 5 and 100 Angstroms.

11. A method for producing light emission from a semiconductor device, comprising the steps of:
providing a terminal-less p-type semiconductor base region disposed between an n-type semiconductor emitter region and an n-type semiconductor collector region;

providing, in said collector region, adjacent the base region, a source of hole carriers:

providing, in said base region, a region exhibiting quantum size effects at a spacing from said source of hole carriers of less than about 300 Angstroms; and applying electrical signals with respect to an emitter terminal, coupled with said emitter region, and a collector terminal coupled with said collector region, to produce said light emission from the base region.

12. The method as defined by claim 11, further comprising the step of providing an optical cavity enclosing at least a portion of said base region, said light emission comprising laser emission.

13. The method as defined by claim 11, further comprising the step of providing a barrier region, to enhance collection and recombination of electrons at the region exhibiting quantum size effects, at the expense of electrical collection at the collector region.

14. The method as defined by claim 11, wherein said step of providing, in said base region, a region exhibiting quantum size effects, comprises providing said region exhibiting quantum size effects at a spacing from said source of hole carriers in the range between about 5 and 100 Angstroms.

15. The method as defined by claim 11, wherein said step of providing a terminal-less p-type semiconductor base region comprises providing a p+ region.

\* \* \* \* \*